United States Patent
Kosaka et al.

(10) Patent No.: US 12,320,836 B2
(45) Date of Patent: Jun. 3, 2025

(54) INSULATION INSPECTION METHOD AND INSULATION INSPECTION APPARATUS

(71) Applicants: DENSO CORPORATION, Kariya (JP); TOYOTA JIDOSHA KABUSHIKI KAISHA, Toyota (JP); AISIN CORPORATION, Aichi (JP)

(72) Inventors: Yuki Kosaka, Kariya (JP); Hideyuki Satou, Toyota (JP); Hideaki Kimura, Kariya (JP)

(73) Assignees: DENSO CORPORATION, Kariya (JP); TOYOTA JIDOSHA KABUSHIKI KAISHA, Toyota (JP); AISIN CORPORATION, Kariya (JP)

(*) Notice: Subject to any disclaimer, the term of this patent is extended or adjusted under 35 U.S.C. 154(b) by 182 days.

(21) Appl. No.: 18/214,962

(22) Filed: Jun. 27, 2023

(65) Prior Publication Data
US 2024/0003959 A1  Jan. 4, 2024

(30) Foreign Application Priority Data
Jun. 30, 2022  (JP) .................................. 2022-106304

(51) Int. Cl.
*G01R 31/12* (2020.01)
*G01R 31/34* (2020.01)
(52) U.S. Cl.
CPC ....... *G01R 31/1272* (2013.01); *G01R 31/346* (2013.01)
(58) Field of Classification Search
CPC .............. G01R 31/1272; G01R 31/346; G01R 31/1263
See application file for complete search history.

(56) References Cited

U.S. PATENT DOCUMENTS

| | | | | |
|---|---|---|---|---|
| 2009/0322345 | A1* | 12/2009 | Kimura | G01R 31/1272 324/544 |
| 2012/0182040 | A1* | 7/2012 | Obata | G01R 31/1272 324/765.01 |
| 2014/0062525 | A1* | 3/2014 | Obata | G01R 31/346 324/765.01 |

(Continued)

FOREIGN PATENT DOCUMENTS

| | | |
|---|---|---|
| JP | 2005-257549 A | 9/2005 |
| JP | 2005-274440 A | 10/2005 |

*Primary Examiner* — Alvaro E Fortich
(74) *Attorney, Agent, or Firm* — Oliff PLC

(57) ABSTRACT

In an insulation inspection method for detecting creeping discharge that occurs in a coil in an armature, a predetermined impulse voltage is applied to the coil, and an electrical current value of a current that flows to a current detector that is connected to the coil is detected. The detected electrical current value is analyzed to acquire a relationship between a frequency and an electrical current value spectrum in the detected electrical current value. Based on the acquired relationship, a total sum of electrical current value spectrum areas in a high-frequency band is calculated as a high-frequency spectrum area. The high-frequency band differs from a predetermined low-frequency band in which partial discharge that occurs in a portion of a thin coating of the wire configuring the coil can be detected. Based on a magnitude of the calculated high-frequency spectrum area, creeping discharge that occurs in the coil is detected.

4 Claims, 13 Drawing Sheets

(56) References Cited

U.S. PATENT DOCUMENTS

2016/0036283 A1* 2/2016 Arai .................... H02K 3/32
                                                    310/208
2020/0044421 A1* 2/2020 Okuda .................. H01T 13/60

* cited by examiner

PARTIAL DISCHARGE

CREEPING
DISCHARGE

INSULATION INSPECTION METHOD AND INSULATION INSPECTION APPARATUS

CROSS-REFERENCE TO RELATED APPLICATIONS

This application is based on and claims the benefit of priority from Japanese Patent Application No. 2022-106304, filed on Jun. 30, 2022. The entire disclosure of the above application is incorporated herein by reference.

BACKGROUND

The present disclosure relates to an insulation inspection method and an insulation inspection apparatus. An insulation inspection method and an insulation inspection apparatus that inspect an insulation state of a coil that is provided in an armature that configures a rotating electric machine are known.

SUMMARY

One aspect of the present disclosure provides an insulation inspection method for detecting creeping discharge that occurs through a space inside a resin portion between metal portions of wires of phases that configure a coil that is provided in an armature that is a subject to be inspected and includes at least a portion of the coil molded by resin. The insulation inspection method includes: applying a predetermined impulse voltage to the coil and detecting an electrical current value of a current that flows to a current detector that is connected to the coil; analyzing the detected electrical current value to acquire a relationship between a frequency and an electrical current value spectrum; and calculating, based on the acquired relationship between the frequency and the electrical current value spectrum, a total sum of electrical current value spectrum areas in a high-frequency band as a high-frequency spectrum area, the high-frequency band differing from a predetermined low-frequency band in which partial discharge that occurs in a portion of a thin coating of the wire that configures the coil can be detected; and detecting creeping discharge that occurs in the coil based on a magnitude of the calculated high-frequency spectrum area.

DESCRIPTION OF THE EMBODIMENTS

Figure 1:
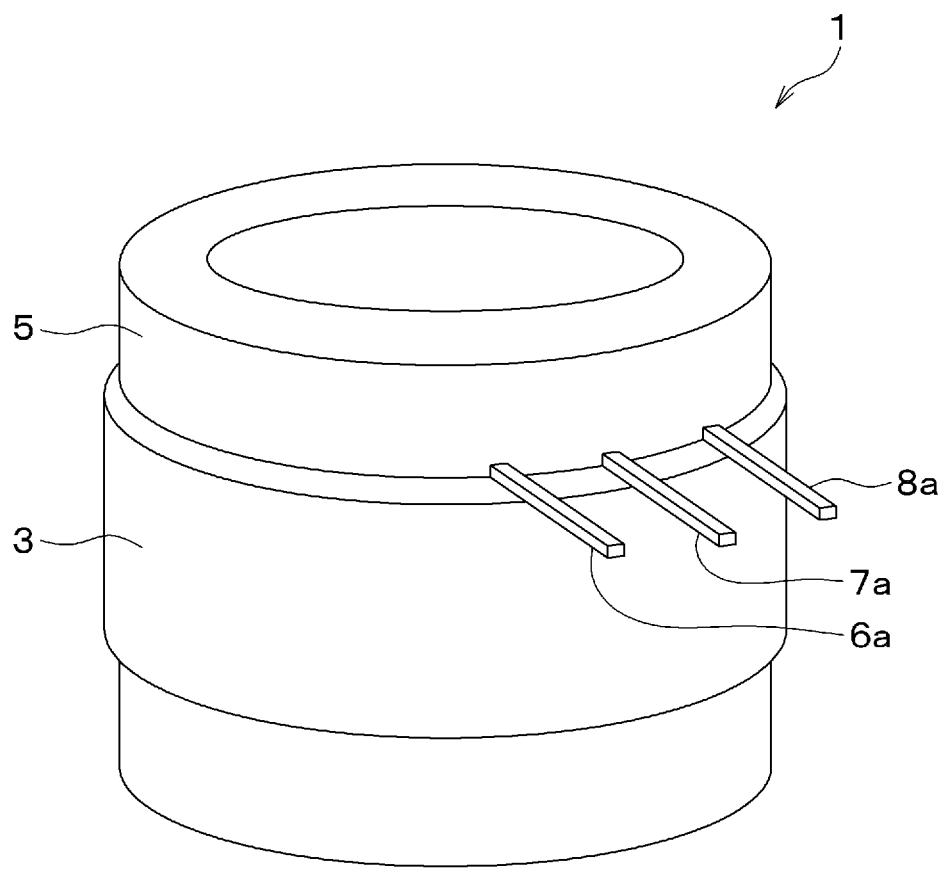
FIG. 1 is a perspective view of a stator as an example of an armature to be inspected by an insulation inspection apparatus according to an embodiment.

The present disclosure relates to an insulation inspection method and an insulation inspection apparatus for inspecting an insulation state of a coil that is provided in an armature (that is, a stator or a rotor) that configures a rotating electric machine.

Conventionally, an insulation inspection method and an insulation inspection apparatus for inspecting an insulation state of a coil that is provided in an armature that configures a rotating electric machine are known.

An insulation inspection apparatus described in JP 2005-274440 A applies an impulse voltage to a motor and detects partial discharge that occurs in a portion of a wire in which a coating is thin, the wire being a wire that configures a three-phase coil. Specifically, in an insulation inspection, the following three inspections are performed. First is an insulation inspection between a wire of a predetermined phase and a wire of another phase that configure the three-phase coil. Second is an insulation inspection between wires of a predetermined phase that configure the three-phase coil. Third is an insulation inspection between a wire of a predetermined phase and a core that configure the three-phase coil.

Here, the armature that configures the rotating electric machine may be an armature in which, in the coil that is provided in the armature, a portion that protrudes from a slot (that is, a coil end) is resin-molded. In this case, a void may be formed inside a resin portion in which the coil is molded. Furthermore, a pinhole may be formed in the coating of the wire that configures the coil. When metal portions of the wires of the phases that configure the coil are connected by spaces (that is, voids and pinholes), creeping discharge may occur through an inner wall surface of the space. In the insulation inspection for the armature, creeping discharge and partial discharge are required to be detected separately (that is, so as to be distinguished therebetween).

However, in the above-described insulation inspection method described in JP 2005-274440 A, partial discharge and creeping discharge are detected in a mixed state, and the creeping discharge alone cannot be detected. In this way, an insulation inspection method and an insulation inspection apparatus that detects creeping discharge and partial discharge separately (that is, so as to be distinguished therebetween), with the resin-molded coil that is It is thus desired to provide an insulation inspection method and an insulation inspection apparatus that are capable of detecting creeping discharge.

A first exemplary embodiment of the present disclosure provides an insulation inspection method for detecting creeping discharge that occurs through a space inside a resin portion between metal portions of wires of phases that configure a coil that is provided in an armature that is a subject to be inspected and includes at least a portion of the coil molded by resin. The insulation inspection method includes: applying a predetermined impulse voltage to the coil and detecting an electrical current value of a current that flows to a current detector that is connected to the coil; analyzing the detected electrical current value to acquire a relationship between a frequency and an electrical current value spectrum; and calculating, based on the acquired relationship between the frequency and the electrical current value spectrum, a total sum of electrical current value spectrum areas in a high-frequency band as a high-frequency spectrum area, the high-frequency band differing from a predetermined low-frequency band in which partial discharge that occurs in a portion of a thin coating of the wire that configures the coil can be detected; and detecting creeping discharge that occurs in the coil based on a magnitude of the calculated high-frequency spectrum area.

As a result, in an insulation inspection for the coil that is provided in the armature, creeping discharge and partial discharge can be detected separately (that is, so as to distinguish therebetween) through use of the high-frequency band that differs from the predetermined low-frequency band that is used to detect partial discharge. Consequently, as a result of this insulation inspection method, an armature that has faulty insulation and in which creeping discharge occurs, and a good armature in which creeping discharge does not occur can be accurately distinguished.

A second exemplary embodiment of the present disclosure provides an insulation inspection apparatus for detecting creeping discharge that occurs through a space inside a resin portion between metal portions of wires of phases that configure a coil that is provided in an armature that is a subject to be inspected and includes at least a portion of the coil molded by resin. The insulation inspection apparatus includes: an impulse power supply that applies a predetermined impulse voltage to the coil; a current detector that detects an electrical current value of a current that flows when the predetermined impulse voltage is applied to the coil; and a determination apparatus. The determination apparatus analyzes the detected electrical current value to acquire a relationship between a frequency and an electrical current value spectrum, calculates, based on the acquired relationship between the frequency and the electrical current value spectrum, a total sum of electrical current value spectrum areas in a high-frequency band as a high-frequency spectrum area, the high-frequency band differing from a predetermined low-frequency band in which partial discharge that occurs in a portion of a thin coating of the wire that configures the coil can be detected, and detects creeping discharge that occurs in the coil based on a magnitude of the calculated high-frequency spectrum area.

As a result, in an insulation inspection for the coil that is provided in the armature, creeping discharge and partial discharge can be detected separately (that is, so as to distinguish therebetween) through use of the high-frequency band that differs from the predetermined low-frequency band that is used to detect partial discharge. Consequently, as a result of this insulation inspection apparatus, an armature that has faulty insulation and in which creeping discharge occurs, and a good armature in which creeping discharge does not occur can be accurately distinguished.

Here, reference numbers within parentheses that are attached to constituent elements and the like indicate an example of corresponding relationships between the constituent elements and the like, and specific constituent elements and the like according to embodiments described hereafter.

Embodiments

Figure 2:
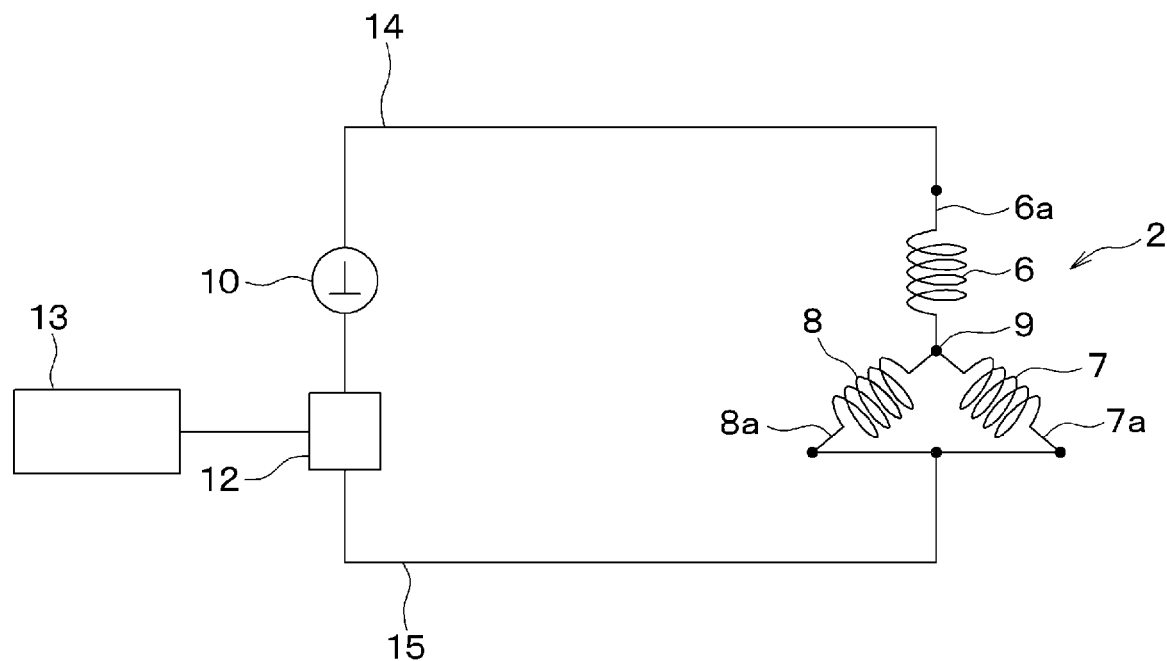
FIG. 2 is an overall configuration diagram illustrating an example of a connection state between the insulation inspection apparatus according to the embodiment and a coil of the stator.
Figure 3:
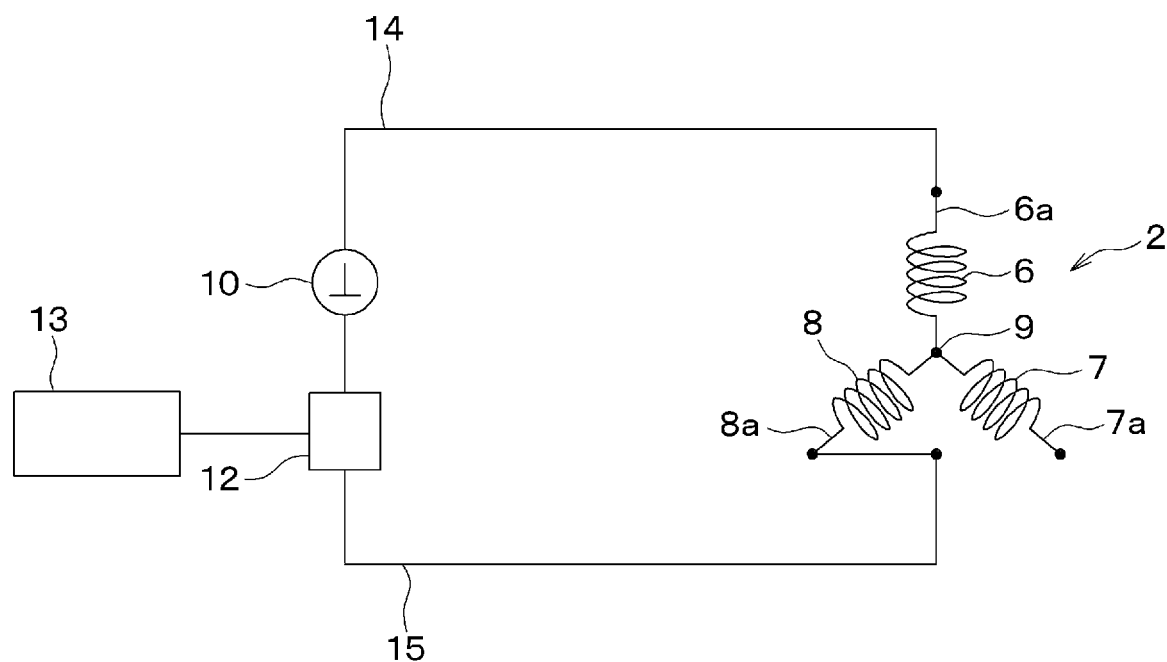
FIG. 3 is an overall configuration diagram illustrating another example of the connection state between the insulation inspection apparatus according to the embodiment and the coil of the stator.

An embodiment of the present disclosure will hereinafter be described with reference to the drawings. As shown in FIGS. 1 to 3, an insulation inspection apparatus according to the present embodiment is an apparatus that, with a stator 1 as a subject to be inspected, detects an insulation state of a coil 2 that is provided in the stator 1. The stator 1 is an example of an armature that configures a rotating electric machine (not shown). Here, for example, a motor generator that is mounted to an electric vehicle is used as the rotating electric machine.

The stator 1 includes an annular core 3 (that is, a stator core), a coil 2 that is inserted into slots (not shown) that are provided in the core 3, and the like. The coil 2 is a three-phase coil that configures a portion of a three-phase alternating-current circuit. In addition, as shown in FIG. 1, the stator 1 includes a resin portion 5 in which a portion (that is, a coil end) of the coil 2 that protrudes from the slots in the core 3 is molded. Here, the resin portion 5 is formed by the coil end being immersed in molten resin during a manufacturing process or the like. Power lines 6a, 7a, and 8a protrude from a portion of the resin portion 5 in which the coil end is molded. The power lines 6a, 7a, and 8a are electrically connected to respective wires of a U-phase coil 6, a V-phase coil 7, and a W-phase coil 8 that configure the three-phase coil 2.

As shown in FIG. 2, the insulation inspection apparatus includes an impulse power supply 10, a current detector 12, a determination apparatus 13, and the like. The coil 2 that is provided in the stator 1 to be inspected is described using a Y-connection coil as an example.

The impulse power supply 10 applies a predetermined impulse voltage that is based on a designated voltage to the coil 2. FIG. 2 shows an example of a method of connection between wires 14 and 15 that extend from the impulse power supply 10, and the coil 2. In the method of connection shown in FIG. 2, one wire 14 that extends from the impulse power supply 10 is connected to an end portion of the power line 6a that extends from a predetermined phase (such as the U-phase coil 6) of the coil 2. The other wire 15 that extends from the impulse power supply 10 branches off part-way and is connected to end portions of the two power lines 7a and 8a that respectively extend from the other two phases (such as the V-phase coil 7 and the W-phase coil 8) of the coil 2.

Here, the method of connection between the wires 14 and 15 that extend from the impulse power supply 10, and the coil 2 is not limited to that shown in FIG. 2. For example, as shown in FIG. 3, the other wire 15 that extends from the impulse power supply 10 may be connected to the end portion of one power line 8a that extends from another phase (such as the W-phase coil 8) of the coil 2.

When the predetermined impulse voltage is applied from the impulse power supply to the coil 2, partial discharge and creeping discharge may occur between the wire of a predetermined phase that is connected to the power line that is connected to the one wire 14 that extends from the impulse power supply 10, and the wire of another phase that is connected to the power line that is connected to the other wire 15 that extends from the impulse power supply 10. The insulation inspection apparatus detects the partial discharge and the creeping discharge separately (that is, so as to distinguish therebetween).

FIGS. 4 to 7 show cross-sections of the wire (hereafter, referred to as a "positive-side wire" for convenience) of the predetermined phase that is connected to the power line that is connected to the one wire 14 that extends from the impulse power supply 10 and the wire (hereafter, referred to as a "negative-side wire" for convenience) of another phase that is connected to the power line that is connected to the other wire 15 that extends from the impulse power supply 10.

Figure 4:
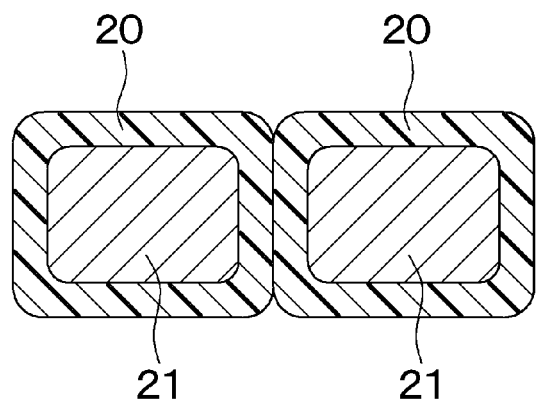
FIG. 4 is a cross-sectional view of two wires that have normal coatings in the coil.

Specifically, FIG. 4 shows wires that each have a coating 20 (that is, a normal coating) that is formed to have a thickness that is within a design range. In this case, discharge does not occur even when the predetermined impulse voltage is applied from the impulse power supply 10 to the coil 2.

Figure 5:
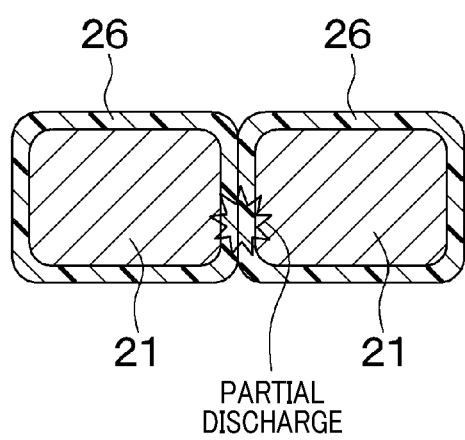
FIG. 5 is a cross-sectional view of two wires that have thin coatings in the coil.

FIG. 5 shows wires that each have a coating (that is, a thin coating 26) that is formed to be thinner than the thickness that is within the design range. In this case, when the predetermined impulse voltage is applied from the impulse power supply 10 to the coil 2, partial discharge occurs between a metal portion 21 that configures the positive-side wire and a metal portion 21 that configures the negative-side wire, through the thin coatings 26.

Figure 6:
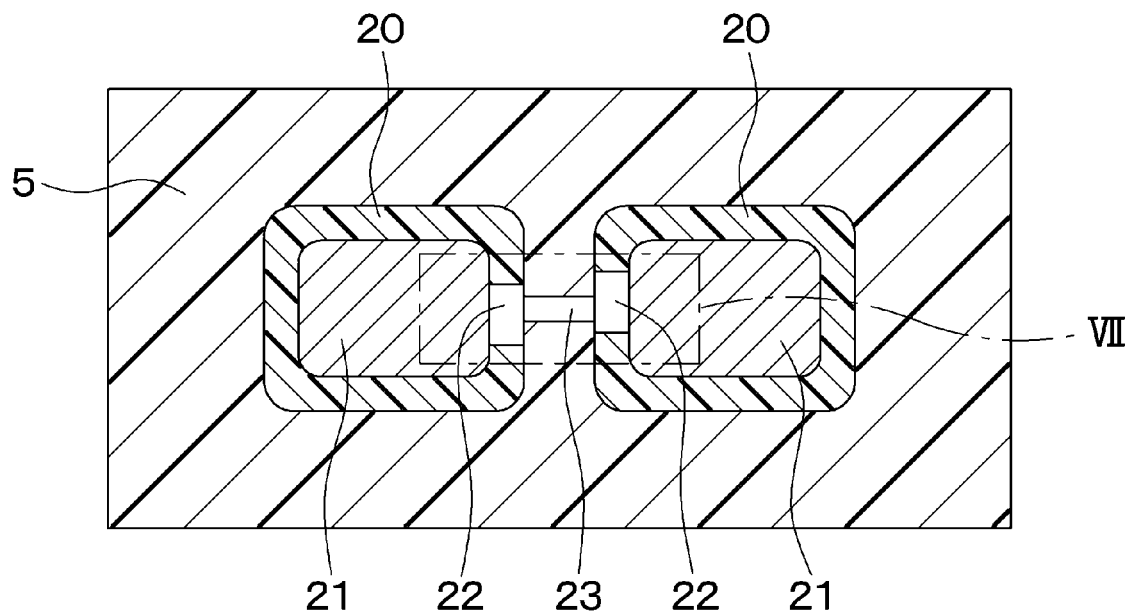
FIG. 6 is a cross-sectional view of two wires in the coil in a state in which pinholes in the coatings of the wires and a void in a resin portion are connected.
Figure 7:
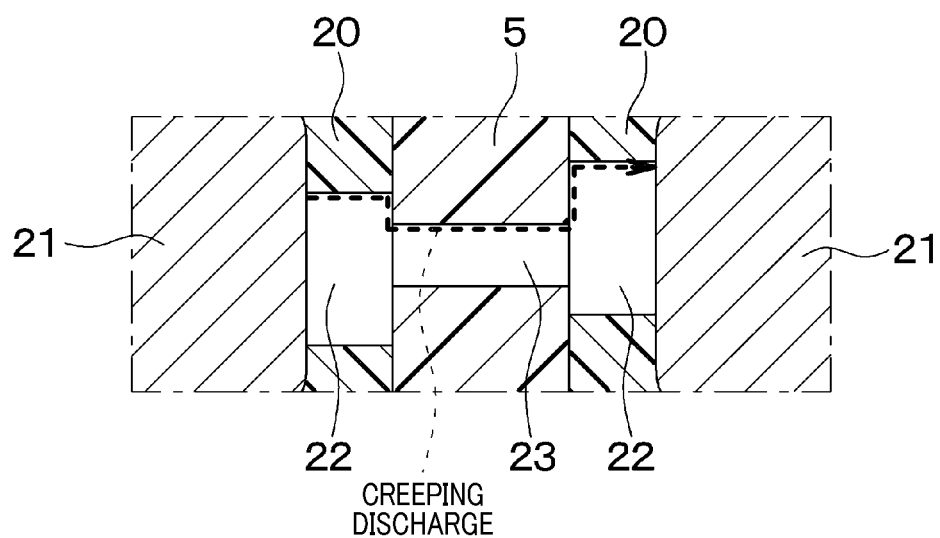
FIG. 7 is an enlarged view of a region VII in FIG. 6.

FIGS. 6 and 7 show an aspect in which, as a result of a pinhole 22 that is formed in the coating 20 of each wire and a void 23 that is formed inside the resin portion 5 in which the wires are molded, the metal portion 21 that configures the positive-side wire and the metal portion 21 that configures the negative-side wire are connected by a space (that is, the void 23 and the pinholes 22). In this case, when the predetermined impulse voltage is applied from the impulse power supply 10 to the coil 2, as indicated by a broken-line arrow, creeping discharge occurs through an inner wall surface of the space (that is, the void 23 and the pinholes 22) between the metal portion 21 that configures the positive-side wire and the metal portion 21 that configures the negative-side wire.

As shown in FIGS. 2 and 3, the current detector 12 detects an electrical current value of a current that flows when the predetermined impulse voltage is applied from the impulse power supply 10 to the coil 2. The electrical current value that is detected by the current detector 12 is transmitted to the determination apparatus 13.

The determination apparatus 13 is configured by a computer, an oscilloscope, and the like. The computer includes a processor, a memory, and the like. The determination apparatus 13 is configured such that the processor runs a program that is stored in the memory and determines whether creeping discharge has occurred in the coil 2.

A determination process that is performed by the determination apparatus 13 will be described with reference to a flowchart in FIG. 8.

At step S10, the determination apparatus 13 acquires the electrical current value that is detected by the current detector 12 when the predetermined impulse voltage is applied from the impulse power supply 10 to the coil 2.

Figure 11:
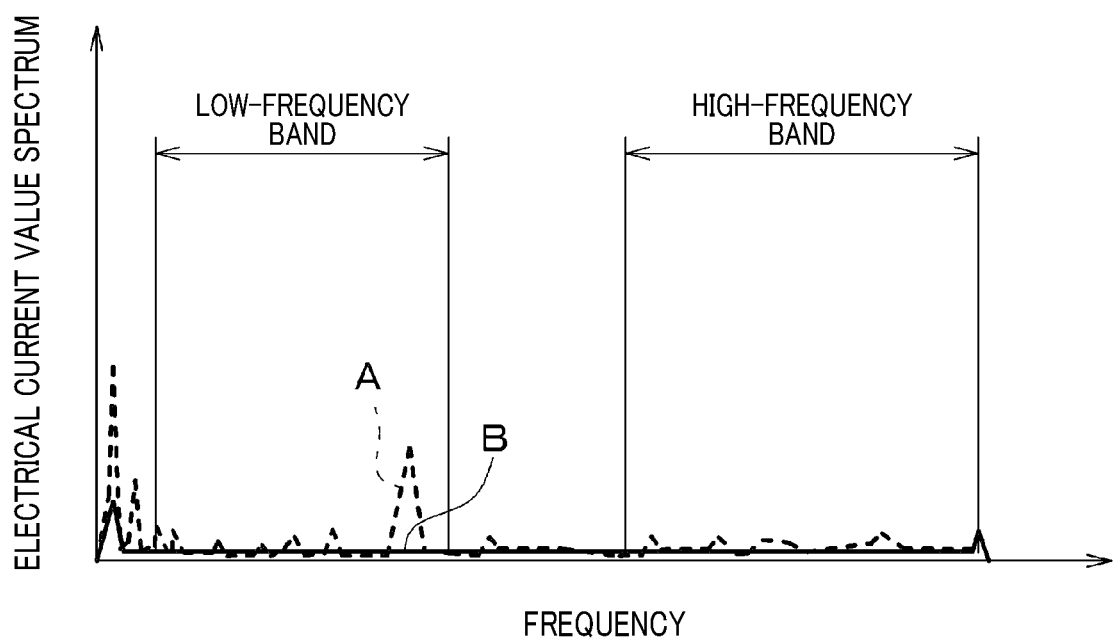
FIG. 11 is a graph illustrating a relationship between a frequency and an electrical current value spectrum, in which fast Fourier transform is performed on an electrical current value that is detected when a predetermined designated voltage is applied to the coil in the verification test shown in FIG. 10.

Next, at step S20, the determination apparatus 13 analyzes the electrical current value that is detected by the current detector 12 by fast Fourier transform (FFT) or the like and acquires a relationship between a frequency and an electrical current value spectrum such as that shown by a graph in FIG. 11. Here, the electrical current value spectrum is also referred to as a current amplitude or a current strength.

Figure 8:
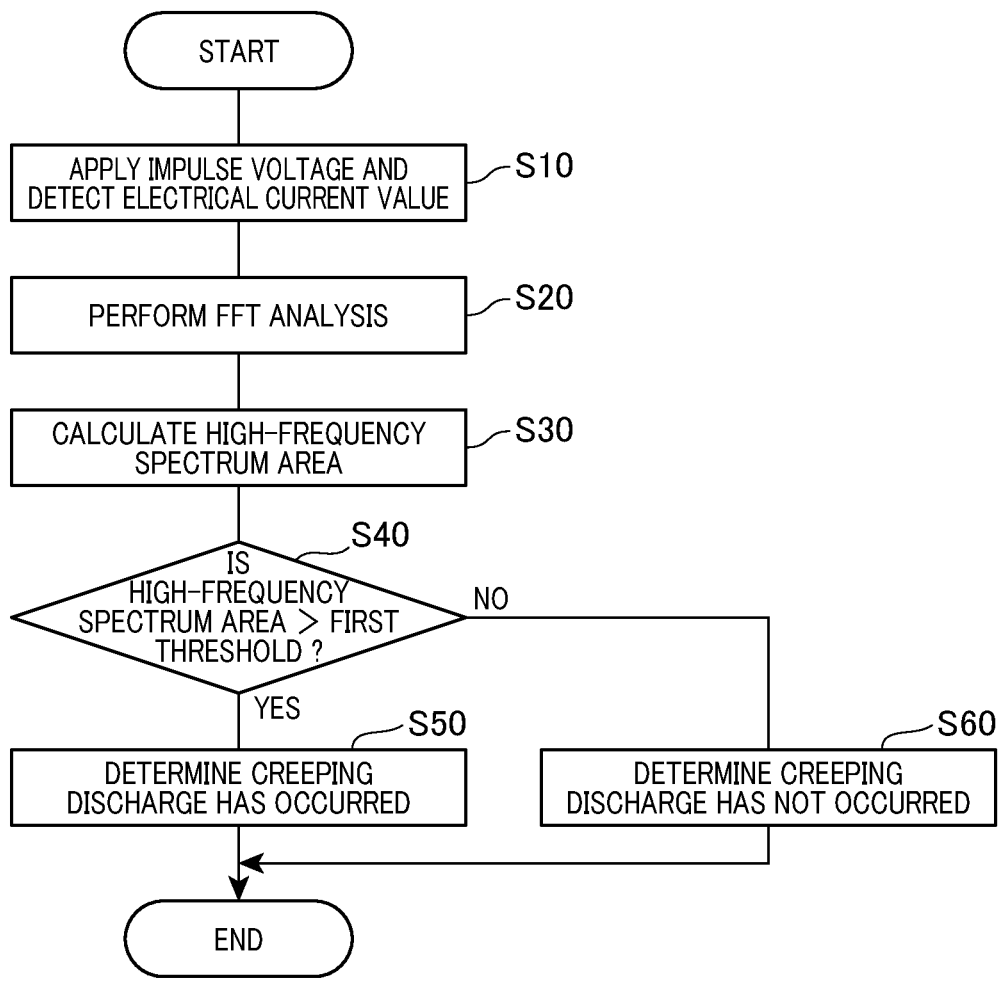
FIG. 8 is a flowchart illustrating a determination process performed by a determination apparatus.

Then, at step S30 in FIG. 8, the determination apparatus 13 calculates a total sum (that is, an integrated value) of the electrical current value spectrum areas in a high-frequency band in which creeping discharge can be detected. According to the present embodiment, the frequency band in which creeping discharge can be detected is a higher frequency band than a frequency band in which partial discharge can be detected. The determination apparatus 13 calculates the total sum of the electrical current value spectrum areas in the high-frequency band in which creeping discharge can be detected.

Here, in the present specification, the total sum of the electrical current value spectrum areas in the high-frequency band that is set for detecting creeping discharge is referred to as a "high-frequency spectrum area." In addition, the total sum of the electrical current value spectrum areas in the low-frequency band that is set for detecting partial discharge is referred to as a "low-frequency spectrum area."

Next, at step S40, the determination apparatus 13 determines whether the high-frequency spectrum area is greater than a predetermined first threshold. The first threshold is set by an experiment or the like in advance and stored in the memory of the determination apparatus 13.

When the high-frequency spectrum area is greater than the predetermined first threshold at step S40, the process proceeds to step S50. At step S50, the determination apparatus 13 determines that creeping discharge has occurred in the coil 2.

Meanwhile, when the high-frequency spectrum area is less than the predetermined first threshold at step S40, the process proceeds to step S60. At step S60, the determination apparatus 13 determines that creeping discharge has not occurred in the coil 2.

In this manner, the determination apparatus 13 is capable of determining whether creeping discharge has occurred in the coil 2.

In addition, the determination apparatus 13 according to the present embodiment is also capable of performing a determination process other than the determination process described above.

Figure 9:
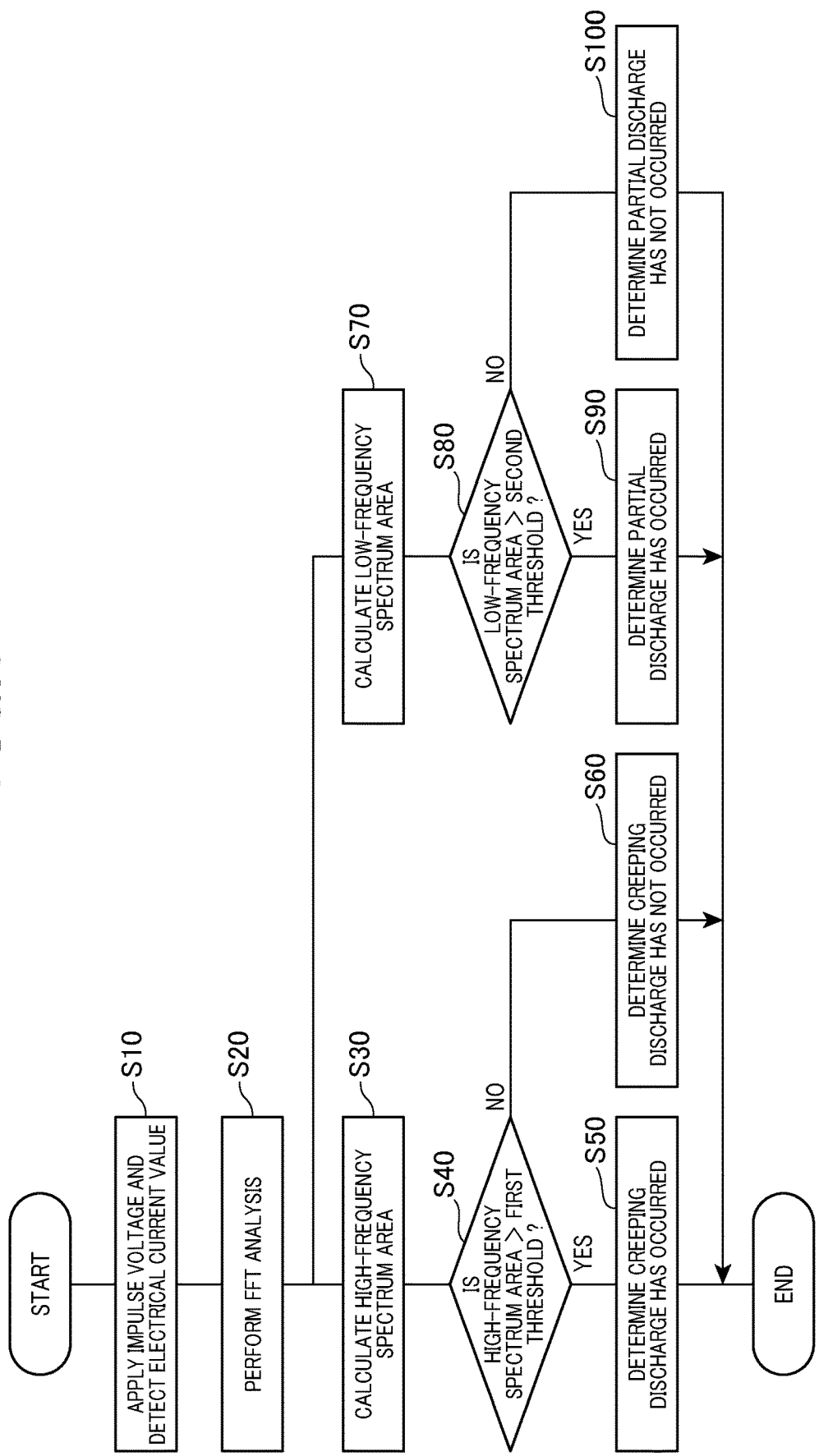
FIG. 9 is a flowchart illustrating another determination process performed by the determination apparatus.

The other determination process that is performed by the determination apparatus 13 will be described with reference to a flowchart in FIG. 9. In this determination process, the determination apparatus 13 is capable of detecting partial discharge that occurs in the coil 2, in addition to detecting creeping discharge that occurs in the coil 2, by a single inspection.

In the flowchart in FIG. 9, steps S10 to S60 are identical to the steps described with reference to the flowchart in FIG. 8.

At step S70 following step S20, the determination apparatus 13 calculates the total sum (that is, the integrated value) of the electrical current value spectrum areas in a predetermined low-frequency band in which partial discharge can be detected. According to the present embodiment, the frequency band in which partial discharge can be detected is a lower frequency band than the frequency band in which creeping discharge can be detected. Therefore, the determination apparatus 13 calculates the total sum of the electrical current value spectrum areas in the low-frequency band in which partial discharge can be detected (that is, the low-frequency spectrum area).

Next, at step S80, the determination apparatus 13 determines whether the low-frequency spectrum area is greater than a predetermined second threshold. The second threshold is set by an experiment or the like in advance and stored in the memory of the determination apparatus 13.

When the low-frequency spectrum area is greater than the predetermined second threshold at step S80, the process proceeds to step S90. At step S90, the determination apparatus 13 determines that partial discharge has occurred in the coil 2.

Meanwhile, when the low-frequency spectrum area is less than the second threshold at step S80, the process proceeds to step S100. At step S100, the determination apparatus 13 determines that partial discharge has not occurred in the coil 2.

In this manner, the determination apparatus 13 is capable of detecting partial discharge that occurs in the coil 2, in addition to detecting creeping discharge that occurs in the coil 2, by a single inspection.

(Verification Test)

Next, a verification test that was performed to verify effectiveness of the insulation inspection by the insulation inspection apparatus, described above, will be described. In the verification test, the coil 2 to which a test piece 25 is connected was used as the coil 2 that is provided in the stator 1. As shown in FIGS. 6 and 7, the test piece 25 is a test piece in which, as a result of the pinhole 22 that is formed in the coating 20 of each wire and the void 23 that is formed inside the resin portion 5 in which the wires are molded, the metal portions 21 of the two wires are connected by a space (that is, the void 23 and the pinholes 22).

(Verification Test 1)

Figure 10:
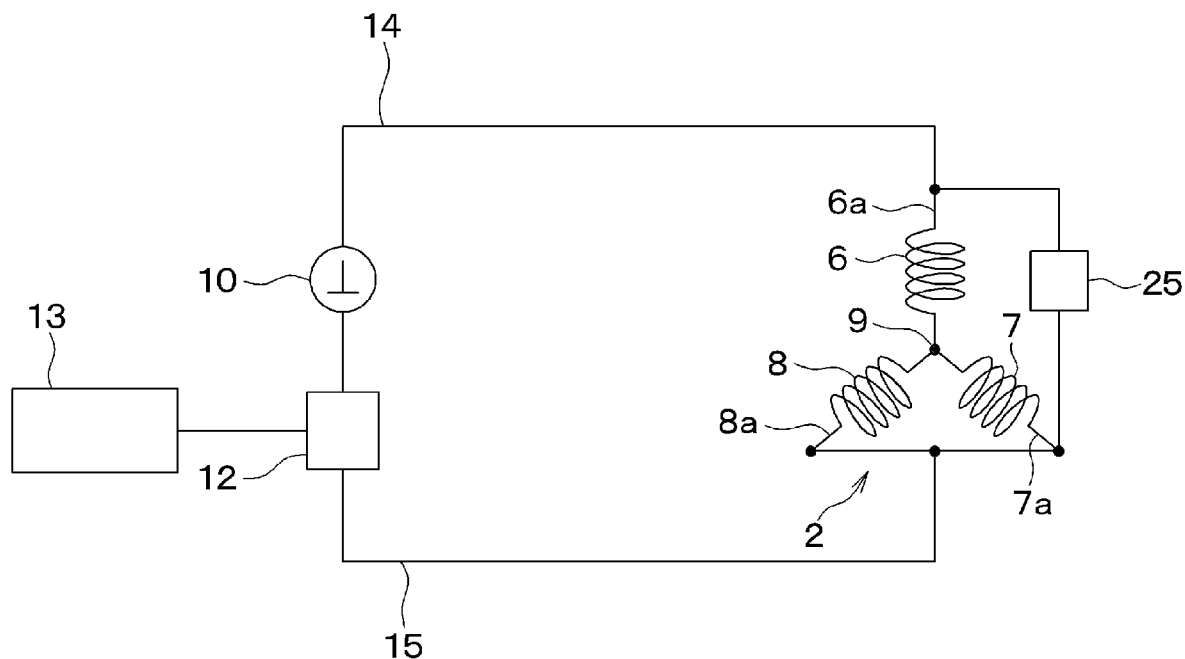
FIG. 10 is a diagram illustrating an aspect in which, in a verification test for effectiveness of an insulation inspection by the insulation inspection apparatus, a test piece is connected in a position far from a neutral point among wires of phases that configure the coil.

As shown in FIG. 10, in verification test 1, the power line 6a that extends from a predetermined phase (such as the U-phase coil 6) of the coil 2 that is provided in the stator 1 and one wire of the test piece 25 are connected. The power line 7a that extends from another phase (such as the V-phase coil 7) of the coil 2 and the other wire of the test piece 25 are connected. In this state, a predetermined impulse voltage was applied from the impulse power supply 10 to the coil 2, and a relationship between the frequency and the electrical current value spectrum was analyzed by fast Fourier transform (FFT) being performed on the electrical current value detected by the current detector 12. Results of the analysis are indicated by a broken line A in a graph in FIG. 11.

In addition, in the verification test 1, the predetermined impulse voltage was applied from the impulse power supply 10 to the coil 2, and the relationship between the frequency and the electrical current value spectrum was analyzed by fast Fourier transform (FFT) being performed on the electrical current value detected by the current detector 12, for the stator 1 in which the test piece 25 is not connected to the coil 2 provided therein (that is, a good stator 1) as well. Results of the analysis are indicated by a solid line B in the graph in FIG. 11.

Furthermore, for each of the stator 1 in which the test piece 25 is connected, indicated by the broken line A in FIG. 11, and the good stator 1 indicated by the solid line B, the total sum of the electrical current value spectrum areas in a predetermined low-frequency band (such as 20 to 200 MHz) in which partial discharge can be detected (that is, the low-frequency spectrum area) was calculated. In addition, for each of the stator 1 in which the test piece 25 is connected, indicated by the broken line A in FIG. 11, and the good stator 1 indicated by the solid line B, the total sum of the electrical current value spectrum areas in a predetermined high-frequency band (such as 300 to 500 MHz) in which creeping discharge can be detected (that is, the high-frequency spectrum area) was calculated.

Here, in the verification test 1, the impulse voltage that is applied from the impulse power supply 10 to the coil 2 was applied ten times each for voltages from a predetermined designated voltage (such as 1 kV) to a designated voltage (such as 4.5 kV) that is greater than the predetermined designated voltage, in 100 V increments, for example. The analysis results indicated in the graph in FIG. 11 are those when the designated voltage is $V\_1$ in the graphs in FIGS. 12 and 13 described hereafter.

Figure 12:
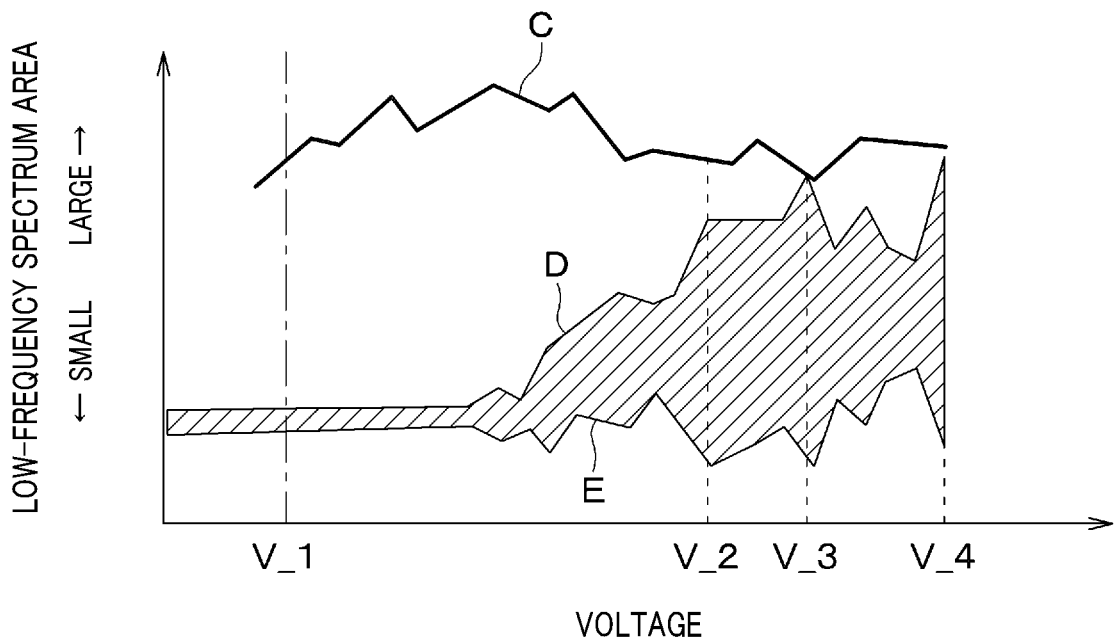
FIG. 12 is a graph illustrating a relationship between a designated voltage that is applied to each of a coil to which a test piece is connected and a good coil, and a low-frequency spectrum area in the verification test shown in FIG. 10.

The graph in FIG. 12 shows the designated voltage (referred to, hereafter, as simply the "designated voltage") of the impulse voltage that is applied from the impulse power supply 10 to the coil 2 on a horizontal axis and the low-frequency spectrum area on a vertical axis.

In the test results of the test performed using the stator 1 in which the test piece 25 is connected to the coil 2 provided therein, a solid line C in FIG. 12 indicates a relationship between the designated voltage and the low-frequency spectrum area.

In the test results of the test performed using the stator 1 in which the test piece 25 is not connected to the coil 2 provided therein (that is, the good stator 1), a shaded area between a solid line D and a solid line E in FIG. 12 shows an area within ±4 standard deviations (σ) from an average of 10 tests (referred to, hereafter, as a "±4σ area"). That is, the solid line D is +4σ and the solid line E is −4σ.

As shown in FIG. 12, in terms of the low-frequency spectrum area, the solid line C that indicates the test results of the test that was performed with the test piece 25 connected to the coil 2 is near the ±4σ area of the test results of the test that was performed using the good stator 1, between the designated voltages V_2 to V_4. Here, at the designated voltage V_3, the solid line C and the solid line D are in contact. Therefore, the stator 1 that has the coil 2 in which creeping discharge occurs and the good stator 1 are difficult to distinguish even when the low-frequency spectrum area is calculated. Consequently, in an inspection method in which the low-frequency spectrum area is calculated (that is, in a conventional inspection method for partial discharge), the stator 1 that has the coil 2 in which creeping discharge occurs may not be distinguished from the good stator 1.

Figure 13:
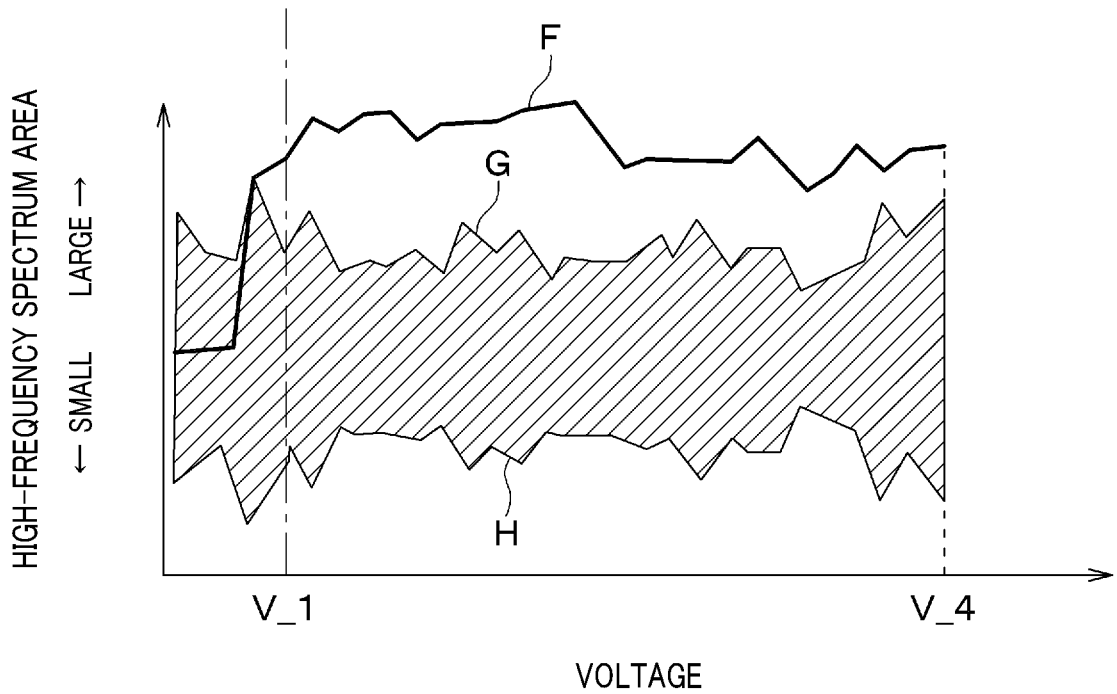
FIG. 13 is a graph illustrating a relationship between a designated voltage that is applied to each of a coil to which a test piece that has a void and the like is connected and a good coil, and a high-frequency spectrum area in the verification test shown in FIG. 10.

In contrast, the graph in FIG. 13 shows the designated voltage on the horizontal axis and the high-frequency spectrum area on the vertical axis.

In the test results of the test performed using the stator 1 in which the test piece 25 is connected to the coil 2 provided therein, a solid line F in FIG. 13 indicates the relationship between the designated voltage and the high-frequency spectrum area.

In the test results of the test performed using the stator 1 in which the test piece 25 is not connected to the coil 2 provided therein (that is, the good stator 1), a shaded area between a solid line G and a solid line H in FIG. 13 shows an area within ±56 standard deviations (σ) from an average of 10 tests (referred to, hereafter, as a "±56σ area"). That is, the solid line G is +56σ and the solid line E is −56σ.

As shown in FIG. 13, in terms of the high-frequency spectrum area, the solid line F that indicates the test results of the test that was performed using the coil 2 to which the test piece 25 is connected significantly deviates from the ±56σ area of the test results of the test that was performed using the good stator 1, between the designated voltages V_1 to V_4. Therefore, it is verified that the stator 1 that has the coil 2 in which creeping discharge occurs and the good stator 1 can be reliably distinguished by the impulse voltages between the designated voltages V_1 to V_4 being applied to the coil 2 and the high-frequency spectrum area being calculated. Consequently, in the inspection method in which the high-frequency spectrum area is calculated, the stator 1 that has the coil 2 in which creeping discharge occurs can be prevented from mixing with the good stator 1.

(Verification Test 2)

Figure 14:
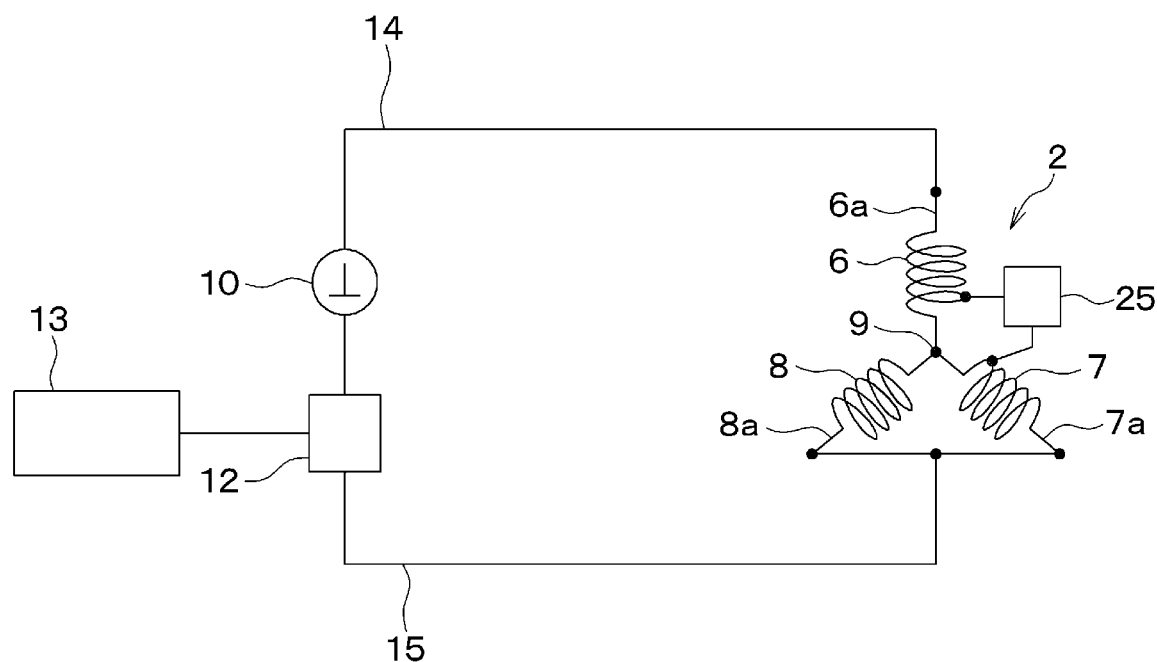
FIG. 14 is a diagram illustrating an aspect in which, in the verification test for effectiveness of the insulation inspection by the insulation inspection apparatus, the test piece is connected in a position near the neutral point among the wires of the phases that configure the coil.

Next, as shown in FIG. 14, in the verification test 2, a portion that is close to a neutral point 9 in a predetermined phase (such as the U-phase coil 6) of the coil 2 that is provided in the stator 1 and one wire of the test piece 25 are connected, and a portion that is close to the neutral point 9 in another phase (such as the V-phase coil 7) of the coil 2 and another wire of the test piece 25 are connected. In this state, the predetermined impulse voltage was applied from the impulse power supply 10 to the coil 2, and the relationship between the frequency and the electrical current value spectrum was analyzed by fast Fourier transform (FFT) being performed on the electrical current value detected by the current detector 12. The results of the analysis are indicated by a broken line I in a graph in FIG. 15.

In addition, in this verification test 2 as well, the predetermined impulse voltage was applied from the impulse power supply 10 to the coil 2, and the relationship between the frequency and the electrical current value spectrum was analyzed by fast Fourier transform (FFT) being performed on the electrical current value detected by the current detector 12, for the stator 1 in which the test piece 25 is not connected to the coil 2 provided therein (that is, the good stator 1). Results of the analysis are indicated by a solid line J in the graph in FIG. 15.

Figure 15:
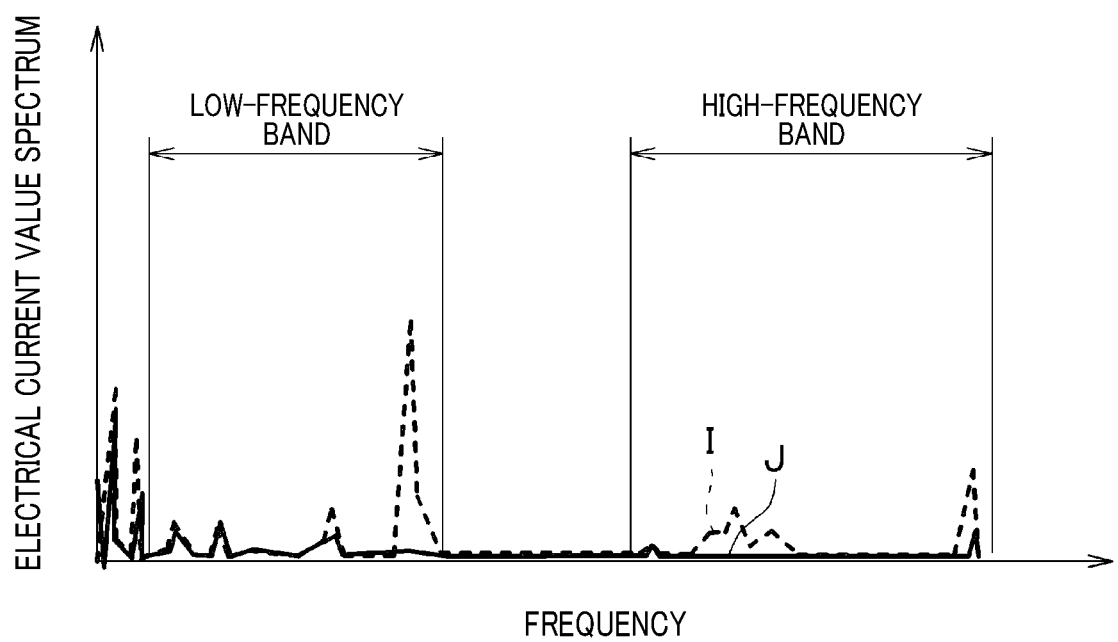
FIG. 15 is a graph illustrating a relationship between the frequency and the electrical current value spectrum, in which fast Fourier transform is performed on the electrical current value that is detected when the predetermined designated voltage is applied to the coil in the verification test shown in FIG. 14.

Furthermore, for each of the stator 1 in which the test piece 25 is connected, indicated by the broken line I in FIG. 15, and the good stator 1 indicated by the solid line J, the total sum of the electrical current value spectrum areas in a predetermined low-frequency band (such as 20 to 200 MHz) in which partial discharge can be detected (that is, the low-frequency spectrum area) was calculated. In addition, for each of the stator 1 in which the test piece 25 is connected, indicated by the broken line I in FIG. 15, and the good stator 1 indicated by the solid line J, the total sum of the electrical current value spectrum areas in a predetermined high-frequency band (such as 300 to 500 MHz) in which creeping discharge can be detected (that is, the high-frequency spectrum area) was calculated. Here, as the test piece 25 is connected to a position that is closer to the neutral point 9 in the coil 2 of each phase, the impulse voltage decreases as a result of resistance in the wire. Therefore, difficulty in detection increases.

In the verification test 2 as well, the impulse voltage that is applied from the impulse power supply 10 to the coil 2 was applied ten times each for voltages from a predetermined designated voltage (such as 1 kV) to a designated voltage (such as 4.5 kV) that is greater than the predetermined designated voltage, in 100 V increments, for example. The graph in FIG. 15 described above is that when the designated voltage is V_21 in the graphs in FIGS. 16 and 17 described hereafter.

Figure 16:
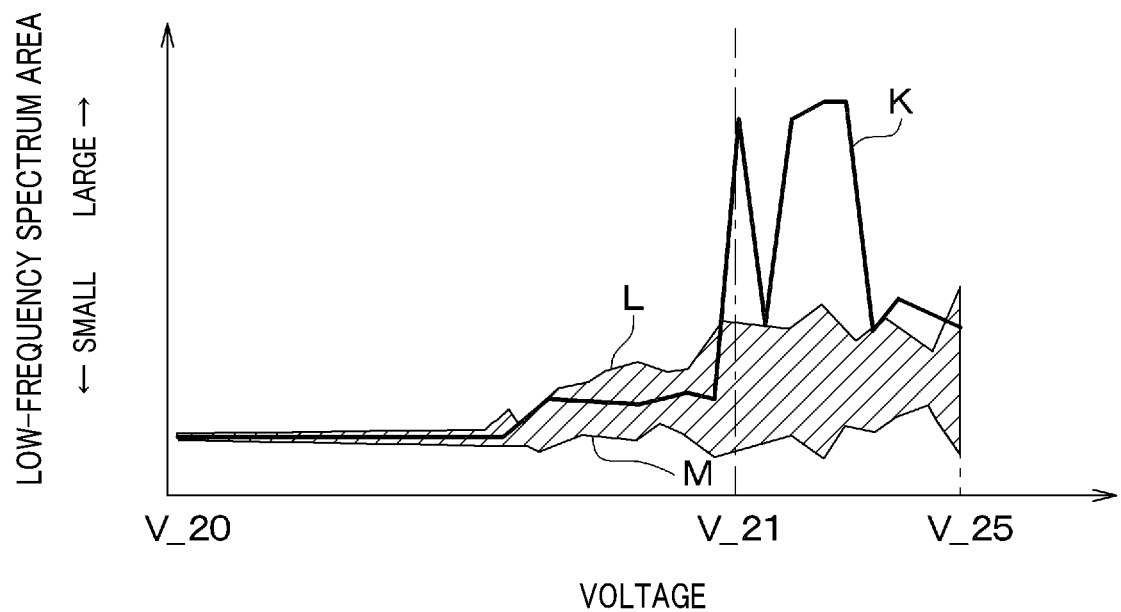
FIG. 16 is a graph illustrating a relationship between the designated voltage that is applied to each of the coil to which the test piece is connected and the good coil, and the low-frequency spectrum area in the verification test shown in FIG. 14.

The graph in FIG. 16 shows the designated voltage on the horizontal axis and the low-frequency spectrum area on the vertical axis.

In the test results of the test performed using the stator 1 in which the test piece 25 is connected to the coil 2 provided therein, a solid line K in FIG. 16 indicates a relationship between the designated voltage and the low-frequency spectrum area.

In the test results of the test performed using the stator 1 in which the test piece 25 is not connected to the coil 2 provided therein (that is, the good stator 1), a shaded area between a solid line L and a solid line M in FIG. 16 shows an area within ±4 standard deviations (σ) from an average of 10 tests (referred to, hereafter, as a "±4σ area"). That is, the solid line L is +4σ and the solid line M is −4σ.

As shown in FIG. 16, in terms of the low-frequency spectrum area, the solid line K that indicates the test results of the test that was performed with the test piece 25 connected to the coil 2 overlaps or is near the ±4σ area of the test results of the test that was performed using the good stator 1, between the designated voltages V_20 to V_25. Therefore, when a section in which creeping discharge occurs is present in a portion near the neutral point 9 of the coil 2, the stator 1 that has the coil 2 in which creeping discharge occurs and the good stator 1 are difficult to distinguish, even when the low-frequency spectrum area is calculated. Consequently, in the inspection method in which the low-frequency spectrum area is calculated (that is, in the conventional inspection method for partial discharge), the stator 1 that has the coil 2 in which the creeping discharge occurs may not be distinguished from the good stator 1.

Figure 17:
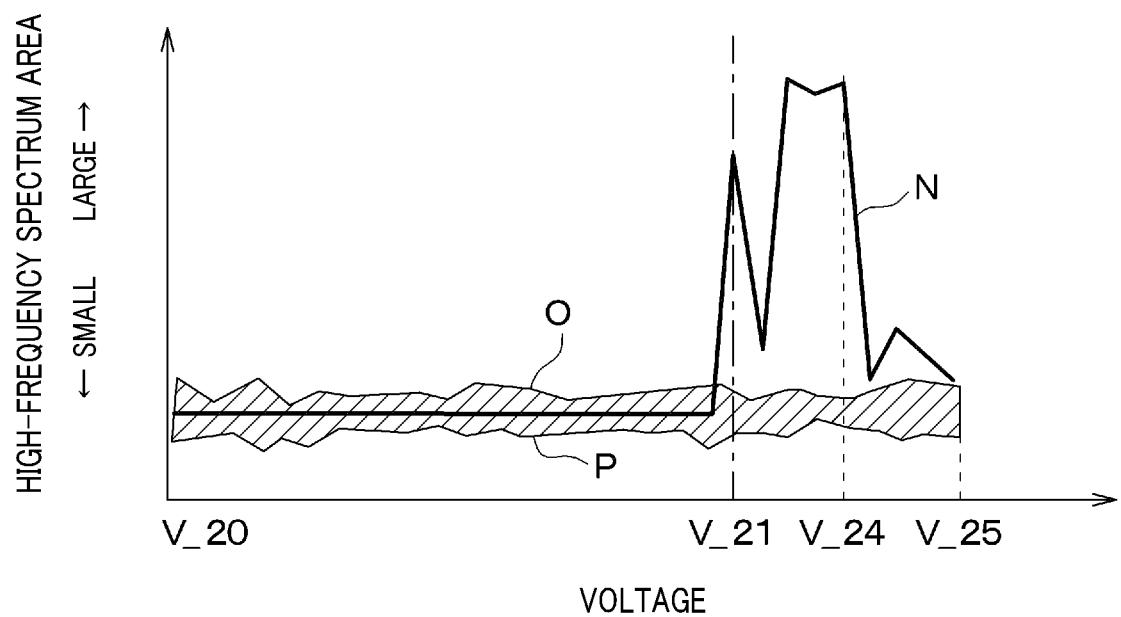
FIG. 17 is a graph illustrating a relationship between the designated voltage that is applied to each of the coil to which the test piece is connected and the good coil, and the high-frequency spectrum area in the verification test shown in FIG. 14.

In contrast, the graph in FIG. 17 shows the designated voltage on the horizontal axis and the high-frequency spectrum area on the vertical axis.

In the test results of the test performed using the stator 1 in which the test piece 25 is connected to the coil 2 provided therein, a solid line N in FIG. 17 shows the relationship between the designated voltage and the high-frequency spectrum area.

In the test results of the test performed using the stator 1 in which the test piece 25 is not connected to the coil 2 provided therein (that is, the good stator 1), a shaded area between a solid line O and a solid line P in FIG. 17 shows an area within ±15 standard deviation ($\sigma$) from an average of 10 tests (referred to, hereafter, as a "±15$\sigma$ area"). That is, the solid line O is +15$\sigma$ and the solid line P is −15$\sigma$.

As shown in FIG. 17, in terms of the high-frequency spectrum area, the solid line N that indicates the test results of the test that was performed using the coil 2 to which the test piece 25 is connected significantly deviates from the ±15$\sigma$ area of the test results of the test that was performed using the good stator 1, between the designated voltages V_21 to V_24. Therefore, it is verified that the stator 1 that has the coil 2 in which creeping discharge occurs and the good stator 1 can be reliably distinguished by the impulse voltages between the designated voltages V_21 to V_24 being applied to the coil 2 and the high-frequency spectrum area being calculated, when a section in which creeping discharge occurs is present in a portion near the neutral point 9 of the coil 2. Consequently, in the inspection method in which the high-frequency spectrum area is calculated, the stator 1 having the coil 2 in which creeping discharge occurs can be prevented from mixing with the good stator 1.

(Summary of the Verification Tests)

Figure 18:
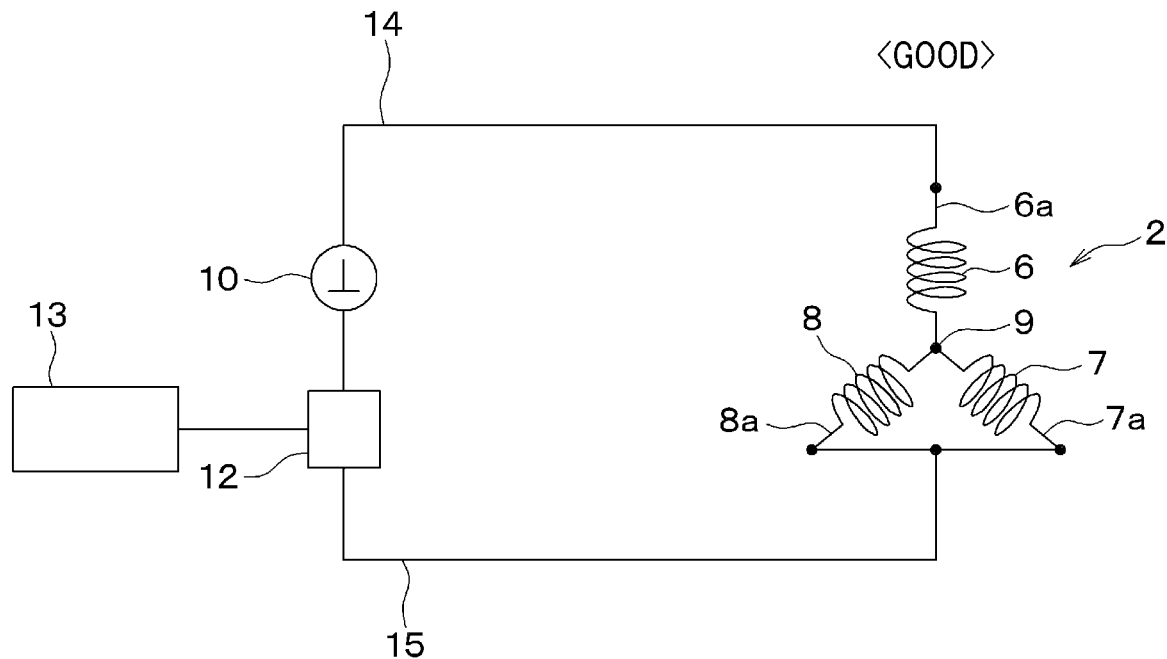
FIG. 18 is a diagram illustrating an aspect in which, in the verification test for effectiveness of the insulation inspection by the insulation inspection apparatus, the good coil is arranged as a subject to be inspected.
Figure 19:
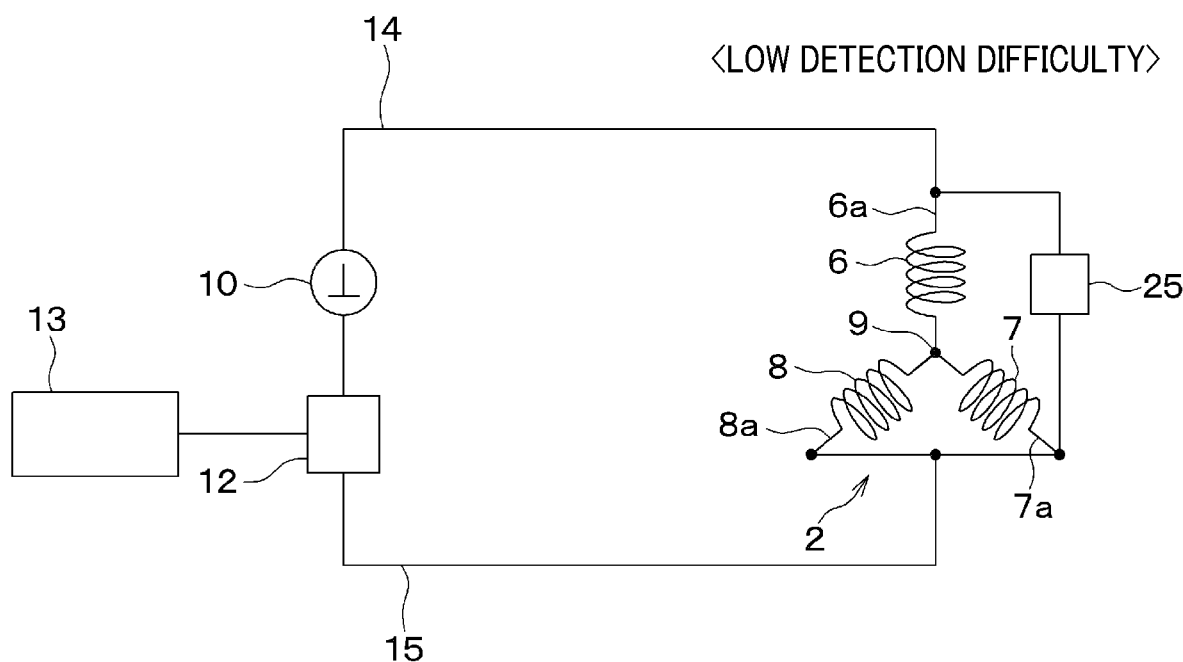
FIG. 19 is a diagram illustrating an aspect in which, in the verification test for effectiveness of the insulation inspection by the insulation inspection apparatus, the test piece is connected in a position far from the neutral point of the coil.
Figure 20:
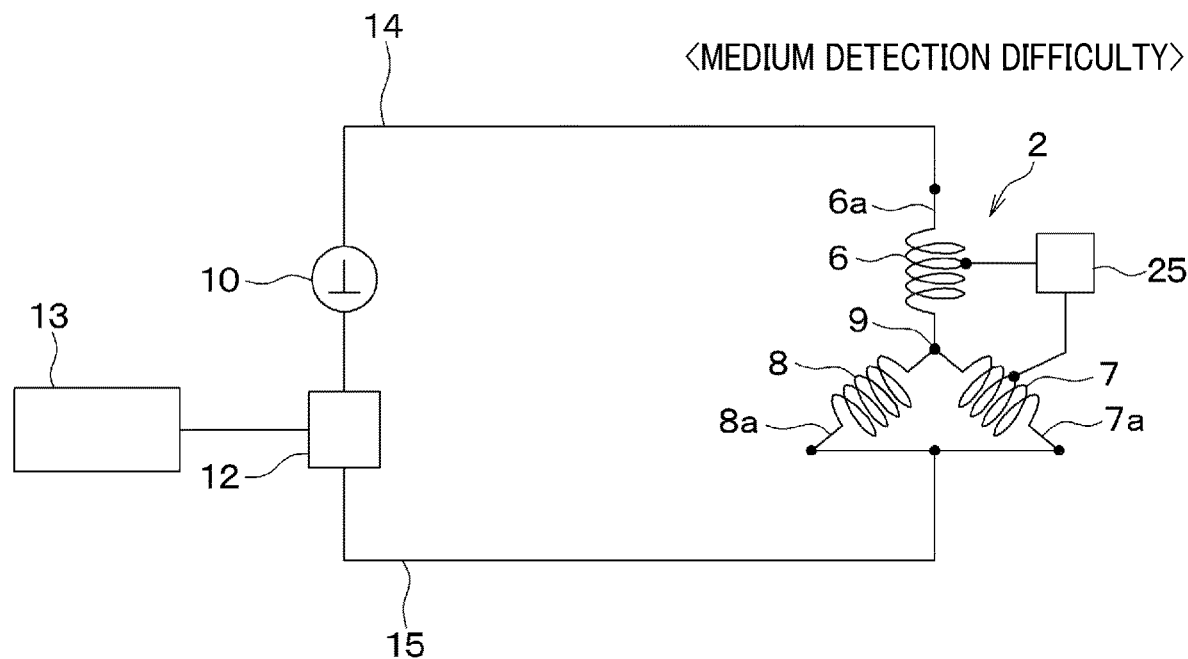
FIG. 20 is a diagram illustrating an aspect in which, in the verification test for effectiveness of the insulation inspection by the insulation inspection apparatus, the test piece is connected in a position closer to the neutral point of the coil than that in FIG. 19.
Figure 21:
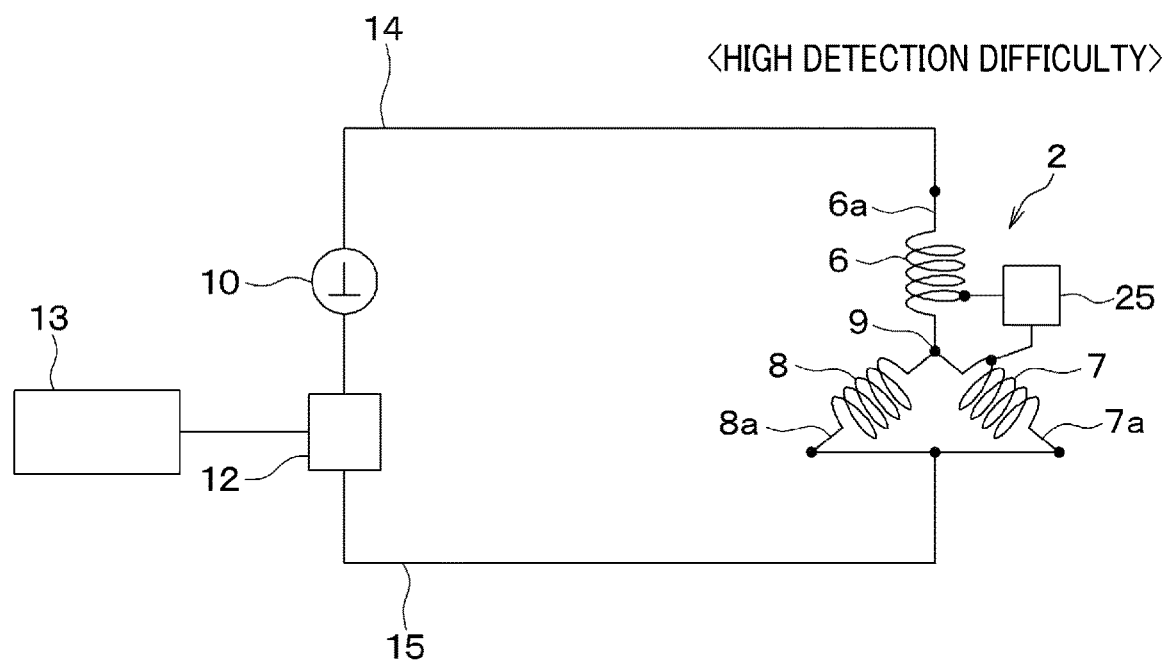
FIG. 21 is a diagram illustrating an aspect in which, in the verification test for effectiveness of the insulation inspection by the insulation inspection apparatus, the test piece is connected in a position closer to the neutral point of the coil than that in FIG. 20.

As shown in FIGS. 18 to 21, tests similar to the verification tests 1 and 2 described above were performed with the test piece 25 connected to various positions in each phase of the coil 2 that is provided in the stator 1. Here, as described above, the impulse voltage decreases as a result of resistance in the wire as the test piece 25 is connected in positions closer to the neutral point 9 of the coil 2 of each phase. Therefore, difficulty in detection increases. In the description below, regarding the coil 2 to be inspected, the coil 2 shown in FIG. 18 is referred to as "good." The coil 2 shown in FIG. 19 is referred to as "low detection difficulty." The coil 2 shown in FIG. 20 is referred to as "medium detection difficulty." The coil 2 shown in FIG. 21 is referred to as "high detection difficulty."

Figure 22:
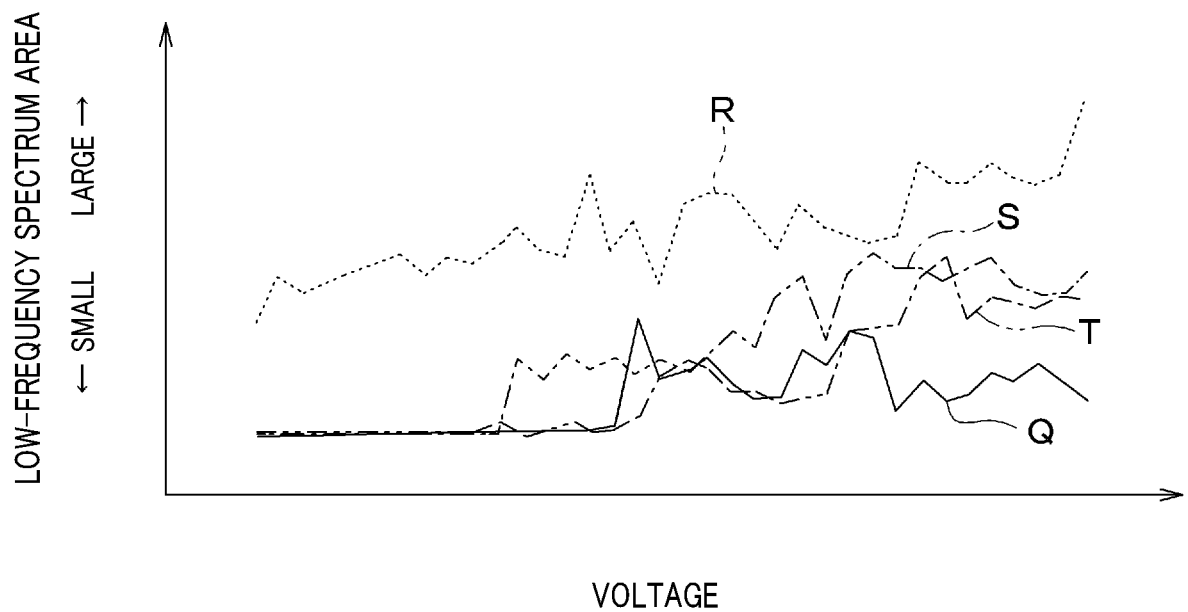
FIG. 22 is a graph illustrating a relationship between the designated voltage that is applied to each of the good coil and the coil to which the test piece is connected, and the low-frequency spectrum area in the verification tests shown in FIGS. 18 to 21.

FIG. 22 shows the designated voltage on the horizontal axis and the low-frequency spectrum area on the vertical axis. A solid line Q indicates "good." A broken line R indicates "low detection difficulty." A single-dot chain line S indicates "medium detection difficulty." A two-dot chain line T indicates "high detection difficulty."

As shown in FIG. 22, the stator 1 that has the coil 2 in which creeping discharge occurs and the good stator 1 are difficult to distinguish even when the low-frequency spectrum area is calculated. Consequently, in the inspection method in which the low-frequency spectrum area is calculated (that is, in the conventional inspection method for partial discharge), the stator 1 that has the coil 2 in which the creeping discharge occurs may not be distinguished from the good stator 1.

Figure 23:
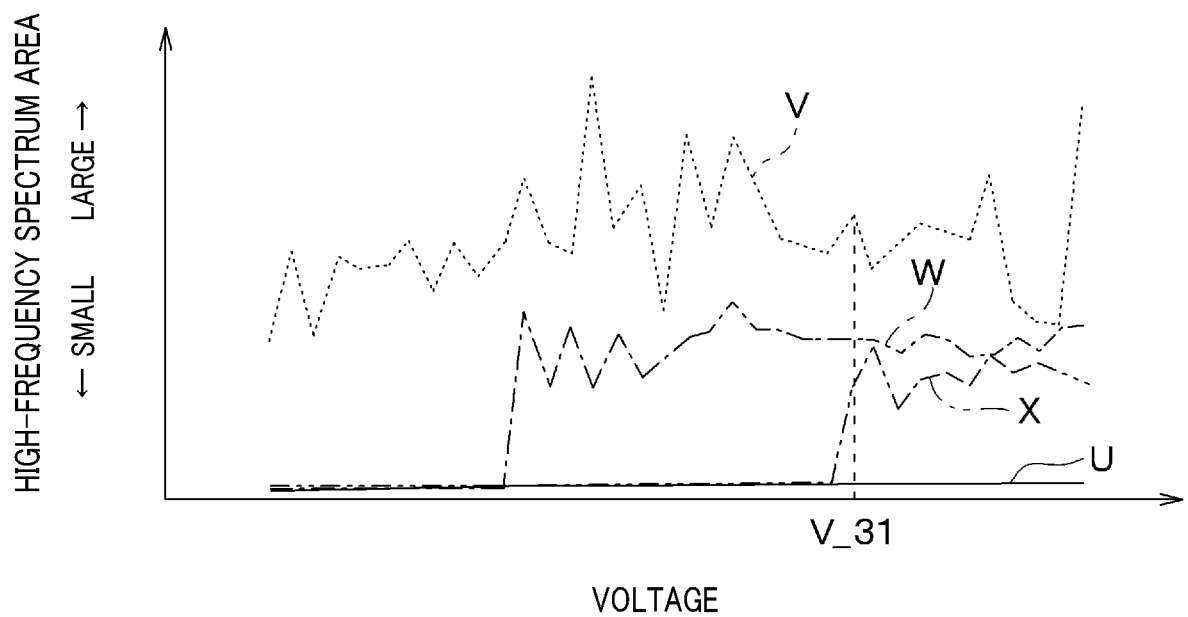
FIG. 23 is a graph illustrating a relationship between the designated voltage that is applied to each of the good coil and the coil to which the test piece is connected, and the high-frequency spectrum area in the verification tests shown in FIGS. 18 to 21.

In contrast, FIG. 23 shows the designated voltage on the horizontal axis and the high-frequency spectrum area on the vertical axis. A solid line U indicates "good." A broken line V indicates "low detection difficulty." A single-dot chain line W indicates "medium detection difficulty." A two-dot chain line X indicates "high detection difficulty."

As shown in FIG. 23, as a result of an impulse voltage of a designated voltage V_31 or greater being applied to the coil 2 and the high-frequency spectrum area being calculated, the stator 1 that has the coil 2 in which creeping discharge occurs and the good stator 1 can be reliably distinguished. Consequently, in the inspection method in which the high-frequency spectrum area is calculated, the stator 1 that has the coil 2 in which creeping discharge occurs can be prevented from mixing with the good stator 1.

The insulation inspection method and the insulation inspection apparatus according to the present embodiment described above achieve the following configuration and resultant working effects.

(1) The insulation inspection method according to the present embodiment is a method for detecting creeping discharge that occurs in the coil 2, with the stator 1 in which at least a portion of the coil 2 provided therein is molded in the resin portion 5 as the subject to be inspected. The insulation inspection method includes the following. That is, a predetermined impulse voltage is applied to the coil 2, and the electrical current value of the current that flows to the current detector 12 that is connected to the coil 2 is detected. In the relationship between the frequency and the electrical current value spectrum that is acquired through analysis of the detected electrical current value, the total sum of the electrical current value spectrum areas in a high-frequency band that differs from a predetermined low-frequency band in which partial discharge that occurs in the portion of the thin coating 26 of the wire that configures the coil 2 can be detected is calculated as the high-frequency spectrum area. Creeping discharge that occurs in the coil 2 is detected based on a magnitude of the high-frequency spectrum area.

As a result, in the insulation test for the coil 2 that is provided in the stator 1, as a result of the high-frequency band that differs from the predetermined low-frequency band used to detect partial discharge being used, creeping discharge and partial discharge can be detected separately (that is, so as to be distinguished therebetween). Consequently, as a result of this insulation inspection method, the stator 1 that has faulty insulation and in which creeping discharge occurs, and the good stator 1 in which creeping discharge does not occur can be accurately distinguished.

(2) The insulation inspection method according to the present embodiment further includes, in addition to detecting creeping discharge that occurs in the coil 2 based on the magnitude of the high-frequency spectrum area, calculating the total sum of the electrical current value spectrum areas in the predetermined low-frequency band as the low-frequency spectrum area, and detecting partial discharge that occurs in the coil 2 based on a magnitude of the low-frequency spectrum area.

Consequently, in the insulation inspection for the coil 2 that is provided in the stator 1, partial discharge and creeping discharge can be detected separately (that is, so as to be distinguished therebetween) by a single inspection.

(3) The insulation inspection apparatus according to the present embodiment includes the impulse power supply 10, the current detector 12, and the determination apparatus 13. The impulse power supply 10 applies the predetermined impulse voltage to the coil 2. The current detector 12 detects the electrical current value of the current that flows to the current detector 12 when the predetermined impulse voltage is applied to the coil 2. The determination apparatus 13 is configured to analyze the electrical current value detected by the current detector 12 to acquire the relationship between the frequency and the electrical current value spectrum, calculate, based on the acquired relationship between the frequency and the electrical current value spectrum, the total sum of the electrical current value spectrum areas in a high-frequency band as the high-frequency spectrum area, the high-frequency band differing from a predetermined low-frequency band in which partial discharge that occurs in the portion of the thin coating 26 of the wire that configures the coil 2 can be detected, and detect creeping discharge that occurs in the coil 2 based on the magnitude of the calculated high-frequency spectrum area.

As a result, the insulation inspection apparatus is capable of detecting the creeping discharge and the partial discharge separately (that is, so as to distinguish therebetween) by using the high-frequency band that differs from the predetermined low-frequency band used to detect partial discharge. Consequently, as a result of the insulation inspection apparatus, the stator 1 that has faulty insulation and in which creeping discharge occurs, and the good stator 1 in which creeping discharge does not occur can be accurately distinguished.

(4) According to the present embodiment, the determination apparatus 13 is configured to calculate, based on the acquired relationship between the frequency and the electrical current value spectrum, the total sum of the electrical current value spectrum areas in the predetermined low-frequency band, and detect partial discharge that occurs in the coil 2 based on the magnitude of the calculated low-frequency spectrum area, in addition to detecting the creeping discharge that occurs in the coil 2 based on the magnitude of the calculated high-frequency spectrum area.

Consequently, the insulation inspection apparatus can detect the partial discharge and the creeping discharge separately (that is, so as to distinguish therebetween) by a single inspection.

Other Embodiments (1) According to the above-described embodiments, the armature that serves as the subject to be inspected is described as the stator 1. However, this is not limited thereto. The armature to be inspected may be a rotor that includes the coil 2.

(2) According to the above-described embodiments, as the coil 2 that is provided in the stator 1 to be inspected, the coil 2 that has a Y connection is described. However, this is not limited thereto. A coil that has a Δ connection, a ΔY connection, a ΔΔ connection, a YY connection, or the like can also be used.

The present disclosure is not limited to the above-described embodiments. Modifications can be made as appropriate within the scope of claims. In addition, the above-described embodiments and portions of the coil can be combined as appropriate unless the embodiments and portions of the coil are unrelated to each other or clearly not able to be combined. Furthermore, according to the above-described embodiments, it goes without saying that an element that configures an embodiment is not necessarily a requisite unless particularly specified as being a requisite, clearly considered a requisite in principle, or the like.

In addition, according to the above-described embodiments, in cases in which a numeric value, such as quantity, numeric value, amount, or range, of a constituent element is stated, the present disclosure is not limited to the specific number unless particularly specified as being a requisite, clearly limited to the specific number in principle, or the like. In a similar manner, according to the above-described embodiments, when a shape, a positional relationship, or the like of a constituent element or the like is mentioned, excluding cases in which the shape, the positional relationship, or the like is clearly described as particularly being a requisite, is clearly limited to a specific shape, positional relationship, or the like in principle, or the like, the present disclosure is not limited to the shape, positional relationship, or the like.

What is claimed is:

1. An insulation inspection method for detecting creeping discharge that occurs through a space inside a resin portion between metal portions of wires of phases that configure a coil that is provided in an armature that is a subject to be inspected and includes at least a portion of the coil molded by resin, the insulation inspection method comprising:
    applying a predetermined impulse voltage to the coil and detecting an electrical current value of a current that flows to a current detector that is connected to the coil;
    analyzing the detected electrical current value to acquire a relationship between a frequency and an electrical current value spectrum in the detected electrical current value;
    calculating, based on the acquired relationship between the frequency and the electrical current value spectrum in the detected electrical current value, a total sum of electrical current value spectrum areas in a high-frequency band as a high-frequency spectrum area, the high-frequency band differing from a predetermined low-frequency band in which partial discharge that occurs in a portion of a thin coating of the wire that configures the coil can be detected; and
    detecting creeping discharge that occurs in the coil based on a magnitude of the calculated high-frequency spectrum area.

2. The insulation inspection method according to claim 1, further comprising:
    calculating, based on the acquired relationship between the frequency and the electrical current value spectrum in the detected electrical current value, a total sum of the electrical current value spectrum areas in the predetermined low-frequency band as a low-frequency spectrum area; and
    detecting partial discharge that occurs in the coil based on a magnitude of the calculated low-frequency spectrum area, in addition to detecting creeping discharge that occurs in the coil based on the magnitude of the calculated high-frequency spectrum area.

3. An insulation inspection apparatus for detecting creeping discharge that occurs through a space inside a resin portion between metal portions of wires of phases that configure a coil that is provided in an armature that is a subject to be inspected and includes at least a portion of the coil molded by resin, the insulation inspection apparatus comprising:

an impulse power supply that applies a predetermined impulse voltage to the coil;

a current detector that detects an electrical current value of a current that flows when the predetermined impulse voltage is applied to the coil; and a determination apparatus that analyzes the detected electrical current value to acquire a relationship between a frequency and an electrical current value spectrum in the detected electrical current value, calculates, based on the acquired relationship between the frequency and the electrical current value spectrum in the detected electrical current value, a total sum of electrical current value spectrum areas in a high-frequency band as a high-frequency spectrum area, the high-frequency band differing from a predetermined low-frequency band in which partial discharge that occurs in a portion of a thin coating of the wire that configures the coil can be detected, and detects creeping discharge that occurs in the coil based on a magnitude of the calculated high-frequency spectrum area.

4. The insulation inspection apparatus according to claim 3, wherein:

the determination apparatus calculates, based on the acquired relationship between the frequency and the electrical current value spectrum in the detected electrical current value, a total sum of the electrical current value spectrum areas in the predetermined low-frequency band as a low-frequency spectrum area, and detects partial discharge that occurs in the coil based on a magnitude of the calculated low-frequency spectrum area, in addition to detecting creeping discharge that occurs in the coil based on the magnitude of the calculated high-frequency spectrum area.

\* \* \* \* \*